United States Patent [19]

Schauer

[11] Patent Number: 5,355,831
[45] Date of Patent: Oct. 18, 1994

[54] EPITAXIALLY COATED SEMICONDUCTOR WAFERS HAVING LOW-OXYGEN ZONE OF ADJUSTABLE EXTENT AND PROCESS FOR PRODUCING SAME

[75] Inventor: Reinhard Schauer, Laufen, Fed. Rep. of Germany

[73] Assignee: Wacker-Chemitronic Gesellschaft für Elektronik-Grundstoffe mbH, Burghausen, Fed. Rep. of Germany

[21] Appl. No.: 879,780

[22] Filed: May 6, 1992

[30] Foreign Application Priority Data

Jun. 13, 1991 [DE] Fed. Rep. of Germany ....... 4119531

[51] Int. Cl.$^5$ .............................................. C30B 25/02
[52] U.S. Cl. ...................................... 117/89; 117/935
[58] Field of Search ............... 156/610, 611, 613, 614, 156/DIG. 64

[56] References Cited

U.S. PATENT DOCUMENTS

| | | | |
|---|---|---|---|
| 3,961,997 | 6/1976 | Chu | 156/614 |
| 4,346,513 | 8/1982 | Nishizawa et al. | 156/613 |
| 4,522,662 | 6/1985 | Bradbury et al. | 156/611 |
| 4,834,831 | 5/1989 | Nishizawa et al. | 156/610 |

FOREIGN PATENT DOCUMENTS

| | | |
|---|---|---|
| 0265988 | 5/1988 | European Pat. Off. |
| 0438959 | 7/1991 | European Pat. Off. |

OTHER PUBLICATIONS

1046b Extended Abstracts, Fall Meeting, Seattle, Wash., Oct. 14–19, 1990 90/2 (1990), Princeton, N.J., US, pp. 576–577.

Journal of the Electrochemical Society, vol. 122, No. 11, Nov. 1975, Manchester, N.H., US, pp. 1523–1531, T. Ishii et al. "Silicon Epitaxial Wafer with abrupt interface by two–step epitaxial growth technique" p. 1526, col. 1. para. 1, p. 1527, col. 1, para. 2.

Solid State Technology 11(6) 1988, p. 24 (The Device and circuit manufacturers' journal).

Solid State Technology, Aug. 1983, Precipitation Process Design for Denuded Zone Formation in CZ–Silicon Wafers, Diethard Huber, Joseph Reffle, pp. 137–142.

*Primary Examiner*—Robert Kunemund
*Attorney, Agent, or Firm*—Collard & Roe

[57] ABSTRACT

For the production of high-quality electronic components based on semiconductors, semiconductor wafers are needed which have a substantially lower oxygen concentration in the wafer region near the surface in which the components are integrated than in the other wafer region. This region, known as "denuded zone," was hitherto obtained by prolonged heat treatment of the wafers in a batch reactor as a consequence of partial diffusion of the oxygen out from the substrate. In the process according to the invention, the low-oxygen region is produced by the epitaxial deposition of two differently doped semiconductor layers on the wafer surface in a single-wafer reactor.

7 Claims, No Drawings

EPITAXIALLY COATED SEMICONDUCTOR WAFERS HAVING LOW-OXYGEN ZONE OF ADJUSTABLE EXTENT AND PROCESS FOR PRODUCING SAME

BACKGROUND OF THE INVENTION

1. Field of the Invention

The present invention relates to a process for producing epitaxially coated semiconductor wafers having low-oxygen zone formed by epitaxy of monocrystalline substrate wafers in a single-wafer reactor. The invention furthermore relates to semiconductor wafers produced by this process.

2. The Prior Art

Semiconductor wafers, in particular composed silicon, which are used to produce electronic components and which are produced by sawing up rod-shaped or block-shaped workpieces, have as a rule oxygen concentrations of up to $9 \times 10^{17}$ atoms/cm$^3$. This oxygen content, which is introduced into the semiconductor material in a process-related manner by the use of quartz workpieces, for example, the crucibles used for Czochralski crystal pulling, is thoroughly desirable because it presents, as a lattice defect, nucleation centers for further impurities in the crystal lattice. This purification effect, known as "internal gettering," as a result of concentrating the residual impurities, is, however, only useful in the interior of the semiconductor wafer. In the surface region of the silicon wafers, in which the electronic components are integrated, these oxygen centers cause considerable disturbance. As a consequence of the process steps encountered in component production such as, for example, epitaxy, dopant treatment, oxidation and heat-treatment steps associated therewith, the oxygen centers have a tendency to precipitate formation and consequently cause stresses in the crystal lattice which result, in turn, in the failure of entire component groups.

It is therefore desirable to use wafers which contain an oxygen-depleted surface zone (so-called denuded zone) which is several μm thick. Processes for producing a denuded zone have been known for a long time. Thus, the oxygen can be caused to diffuse out to the surface by heat-treating silicon wafers in a furnace (at temperatures of, for example, 1,000° C.-1,200° C.) under an inert gas atmosphere. After a time of five hours at a temperature of 1,000° C., the layer thickness of the denuded zone achievable solely by diffusing out oxygen is more than 10 μm (Huber, D.; Reffle, J.: Solid State Techn. 26(8), 1983, page 183).

The production of a denuded zone is advantageously carried out before, during or after the deposition, necessary as part of the component production, of a doped epitaxial layer because both operations require similar process temperatures and do not mutually impede one another. The thickness of the denuded zone produced depends essentially on the allowed diffusion times.

The deposition of an epitaxial layer serves, as a rule, to produce a sharp transition in the electrical properties of the semiconductor material. Normally, a steep increase in the resistance profile is desirable at the junction between the substrate and the epitaxial layer near the surface. Substrate and epitaxial layers are therefore normally differently doped.

In accordance with this prior art, the denuding step was hitherto carried out in a batch epitaxial reactor. Those are reactors having a capacity to receive more than one wafer, as a rule 4–50 wafers. As a result of the time required to deposit the epitaxial layer (growth rates in this type of reactor: 1 μm to 2 μm per minute), these reactors have sufficiently long cycle times to also enable the formation of a denuded zone meeting the specifications required hitherto—the thickness of the low-oxygen layer near the surface to be maintained should be at least 5 μm. However, the expectations relating to the quality and extent of the denuded zone imposed by the component producers have risen. In order to satisfy these requirements, increasing residence times of the wafers in the batch reactor have to be accepted, as a result of which the process becomes increasingly uneconomical.

In addition, batch reactors have some disadvantages which have resulted in the fact that so-called single-wafer reactors are now preferably used for epitaxial processes. As a consequence of the long processing time of the wafers in the batch reactor, dopants diffuse out of the substrate and are partly incorporated in the growing epitaxial layer. Under these circumstances, the desired steep resistance profile at the junction between substrate material and epitaxial layer is reduced in an unacceptable manner (autodoping effect). Similar difficulties occur as a result of the fact that dopants systematically introduced in the course of a sequence of processing steps can virtually not be removed completely from the relatively large volume of such reactors and are later absorbed in the epitaxial layer in an undesirable manner (memory effect). The large wafers having diameters of 150 mm to 200 mm and above, which have to be processed to an increasing extent, exacerbate these problems and increasingly make the use of conventional batch reactors additionally more unattractive.

Single-wafer reactors have higher growth rates (5 μm/minute and higher) and, consequently, make possible the epitaxy of even large wafers in shorter periods of time, the problems described and occurring with the use of batch reactors being insignificant.

A disadvantage of using single-wafer reactors is, however, that the residence time of the wafer in the reactor is insufficient to achieve the required extent of the denuded zone exclusively by heat treatment. Although the extent of the denuded zone can be increased to an adequate extent by additional heat treatment, this reduces the cost effectiveness of the process considerably, in particular in the case of high substrate oxygen content. The use of low-oxygen substrate wafers is, however, ruled out because the internal gettering described at the outset is only inadequately effective in such material.

SUMMARY OF THE INVENTION

It is therefore an object of the present invention to provide a process which makes it possible to produce epitaxially coated wafers having a denuded zone of adjustable extent economically in a single-wafer reactor. Furthermore, wafers produced by this process should have a sharp resistance profile at the junction between the denuded zone and the epitaxial layer near the surface.

This object is achieved according to the present invention by a process for producing epitaxially coated semiconductor wafers having low-oxygen zone, which comprises first depositing epitaxially a semiconductor layer having the electrical properties of the substrate on the substrate wafer and then growing a further layer having a different doping in a second epitaxial step.

The single-wafer reactors used in the process according to the invention are known to the person skilled in the art and are described, for example, in *Solid State Technology*, 11(6) 1988, page 24. They are notable for the fact that only one wafer is processed per working cycle in all cases. A wafer which is mounted on a substrate holder is heated by heating lamps or by means of a resistance heater in a processing chamber which can be relatively small, for example having a volume of four liters, compared with the processing chambers used in batch reactors. As the process gas flows through, an epitaxial layer deposits on the substrate wafer.

Reactors of this type are particularly suitable for processing wafers of large diameters of 150 mm to 200 mm and above, but even smaller wafers having diameters between 75 mm and 150 mm can be epitaxially coated therein.

The achievable growth rates of 5 $\mu$m/minute and above are so high that an economical production of fairly large layer thicknesses—depending on wafer diameter—of up to 100 $\mu$m is made possible.

As the substrate, monocrystalline silicon wafers are preferably used which, depending on the required resistance, may contain dopants, such as for example, boron, antimony, phosphorous or arsenic. The crystal orientation is not restricted but, in particular, wafers 250 $\mu$m to 1,000 $\mu$m thick having a 1-0-0 and 1-1-1 orientation are used.

According to the present invention, the low-oxygen zone on the substrate is not produced primarily by the diffusion out of oxygen from the substrate, but primarily by the deposition of a first oxygen-free epitaxial layer on the substrate. The wafer thickness increases as a result of the deposition of the first epitaxial layer by 1 $\mu$m to 20 $\mu$m, but preferably by 5 $\mu$m to 10 $\mu$m, depending on processing conditions. The extent of the denuded zone produced corresponds to the sum of the extent of the first epitaxial layer and of the low-oxygen substrate region produced by the diffusion out of oxygen during the epitaxy. It can therefore be varied in wide limits by the choice of the layer thickness of the first epitaxial layer. The doping of the first epitaxial layer is advantageously chosen in such a way that substrate and epitaxial layer have a resistivity which is the same, or similar within narrow tolerances of 5% to 20%, preferably of 5% to 10%. The resistivity of the substrate has, as a rule, a value of 0.005 ohm.cm to 100 ohm.cm, in particular of 0.005 ohm.cm to 0.05 ohm.cm. In principle, however, the invention also allows the deposition of a first epitaxial layer having a resistivity different from the substrate.

Before an epitaxial layer is deposited, the reactor chamber and substrate surface are preferably pre-cleaned. Preferably, this pre-cleaning includes flushing the reactor chamber with inert gas, for example with nitrogen, and in a surface treatment of the wafers with etching gas, for example with hydrogen chloride, followed by a repeat flushing with inert gas. However, the unloaded reactor alone may also be subjected to such a pre-cleaning, in particular if the cleaning conditions might damage the semiconductor wafer.

The process gases used in silicon epitaxy are well known. The flushing gases used are preferably nitrogen, argon or hydrogen. Hydrogen is preferably used as the carrier gas for the gases which deposit silicon, such as, for example, tetrachlorosilane, trichlorosilane, dichlorosilane or silane. The dopants are mixed in the form of their gaseous compounds, for instance diborane, phosphine or arsine, with hydrogen to form doping gas. Hydrogen chloride is a preferred etching and cleaning gas.

Silicon is advantageously deposited at a temperature of 900° C.–1,250° C., in particular of 1,100° C.–1,200° C. During the etching operation, temperatures of 900° C.–1,300° C., in particular 1,200° C., are preferably used. The epitaxy is normally carried out under atmospheric pressure, but a deposition at reduced pressures down to 10 mm Hg is possible in special process variants. It has proved advantageous to cause the wafer holder to rotate at a rotation speed of 1 r.p.m. to 50 r.p.m., in particular at 25 r.p.m., at the same time.

The deposition, according to the invention, of a first epitaxial layer with the formation of a denuded zone comprising said layer and a part of the substrate near the surface is followed, as a rule, by the growth of a second epitaxial layer. This second layer normally has a higher resistivity than that of the substrate and of the first epitaxially deposited layer.

The deposition rates during the epitaxy are normally 2 $\mu$m/minute to 6 $\mu$m/minute, preferably 5 $\mu$m/minute. The flow rate of silicon-containing process gases through the reactor, for example of trichlorosilane, is between 1 g/minute and 50 g/minute, in particular 20 g/minute. Flushing gas, for example, nitrogen or hydrogen, is, as a rule, passed through the reactor at 1 standard liter per minute (SLM) to 200 SLM, flow rates typically being from 20 SLM to 80 SLM.

The flow rates of etching gas, for example hydrogen chloride, have values between 1 SLM and 20 SLM, preferably 20 SLM.

The proportion of dopant, for example diborane, contained in the doping gas is 10 ppm to 10,000 ppm, typically 1,000 ppm. The flow rate of doping gas is matched to the desired dopant concentration in the epitaxial layer. For the first layer deposited, it is in the range from 1 SLM to 4 SLM, preferably 2 SLM, and for the second layer from 1 standard cubic centimeter per minute (SCCM) to 200 SCCM, preferably 100 SCCM.

The process according to the invention is used to produce epitaxially coated semiconductor wafers, in particular those of silicon, having a denuded zone of adjustable extent. The process has proved particularly beneficial in producing wafers having a large diameter, for instance of at least 150 mm. Advantageously, it is used for wafers having a crystal orientation of 1-0-0 or 1-1-1. The preferably used wafer thickness is 725 $\mu$m. The resistivity of the substrate used is 0.005 ohm.cm to 100 ohm.cm, in particular 0.005 ohm.cm to 0.05 ohm.cm, with a doping normally of arsenic, antimony, phosphorus, boron, gallium or aluminum.

The wafers obtainable by the process according to the invention have the following additional characteristics: the thickness of the first epitaxial layer, which forms the main part of the denuded zone, can be variably tailored and is preferably 1 $\mu$m to 20 $\mu$m, and particularly advantageously 10 $\mu$m. As a result of the diffusion out of oxygen from the substrate surface during the epitaxy, the whole denuded zone extends across the first epitaxial layer a further 2 $\mu$m to 10 $\mu$m into the substrate. In the denuded zone, the oxygen content is considerably reduced compared with the substrate. Preferably, an oxygen content of less than $1 \times 10^{17}$ atoms/cm$^3$ is achieved.

Due to the process according to the present invention, the second epitaxially deposited layer of the wafer has a similarly low oxygen content to that of the first epitaxial layer. However, the resistivity of the second layer is, as a rule, different from that of the first layer. Normally, it is higher and is 0.1 ohm.cm to 1,000 ohm.cm, preferably 3 ohm.cm. The layer thickness established is 1 μm to 100 μm, preferably 3 μm. As dopant, a compound from the same group of substances is selected as that used to dope the substrate or first epitaxial layer.

The depositing on the substrate wafer of a first epitaxial layer takes place at a first temperature, while the depositing on the first epitaxial layer of a second epitaxial layer takes place at a second temperature which is lower than the first temperature.

Semiconductor wafers produced by the process according to the invention have a number of advantageous properties. As a result of depositing a first oxygen-free epitaxial layer, the extent of the denuded zone produced is readily adjustable and exactly reproducible. The oxygen content of the substrate has virtually no effect on the production of the denuded zone. The denuded zone is distinguished by a resistivity in the region it covers which differs only by up to 10% from a mean value. The change in resistivity towards the epitaxial layer near the surface is characterized by a steep gradient, which is a further important quality criterion. In addition, the concentration of crystal defects in the said epitaxial layer is substantially less than that in the substrate.

Previous prior art process disadvantages, such as the autodoping as a result of long heat-treatment times, the memory effect due to large reactor volumes, and a lack of cost effectiveness due to long residence times in the reactor, are largely avoided by the process according to the invention. As a result of the invention, the production of epitaxially coated wafers having a denuded zone of adjustable extent becomes particularly economical.

DETAILED DESCRIPTION OF THE PREFERRED EMBODIMENT

Other objects and features of the present invention will become apparent from the following detailed description considered in connection with the accompanying example which discloses one embodiment of the present invention. It should be understood, however, that the example is designed for the purpose of illustration only and not as a definition of the limits of the invention.

EXAMPLE

A monocrystalline silicon wafer of the crystal orientation 1-0-0 having a thickness of 725 μm and a diameter of 200 mm is placed on the susceptor of a single-wafer reactor and heated to 900° C. The processing chamber, which had previously been flushed with hydrogen, is heated to 1,190° C. A susceptor rotation of 25 r.p.m. is maintained, with a hydrogen flow of 20 standard liters per minute.

For the purposes of stabilization, the hydrogen flow is increased to 60 standard liters per minute before the deposition and, to achieve the required resistivity value of 0.01 ohm·cm, the trichlorosilane flushing is adjusted to about 22 g/minute, and the doping with diborane to 1.8 standard liters per minute, with 1,000 ppm of diborane in the hydrogen.

After 50 seconds, the deposition of the first, heavily doped epitaxial layer is started by diverting the process gas flow to the processing chamber. After 135 seconds, a 10 μm thick layer has been deposited. A hydrogen flushing with 180 standard liters per minute then takes place for 10 seconds.

The temperature is then lowered to 1,055° C. and the hydrogen flow is reduced to 100 standard liters per minute. The doping is reduced to 90 standard cubic centimeters per minute, which results in a resistivity of about 3 ohm·cm. After a stabilization phase, the second epitaxial layer having a thickness of 2.8 μm is deposited at a temperature of 1,080° C., with otherwise identical parameters.

After flushing the chamber with hydrogen for 10 seconds, the temperature is reduced to 900° C. within 30 seconds and the hydrogen flow is reduced to 20 standard liters per minute. After the susceptor rotation has been stopped, the wafer is unloaded while flushing with nitrogen.

The process chamber is then etched without wafer for 35 seconds at 1,200° C. with a mixture of 20 standard liters per minute of hydrogen and 20 standard liters per minute of hydrogen chloride, flushed for 7 seconds with 100 standard liters per minute of hydrogen and then etched again for 20 seconds.

After reducing the temperature to 900° C., increasing the hydrogen flow and switching off the hydrogen chloride, a new processing cycle follows, with the loading of the next wafer.

While only a single embodiment of the present invention has been described, it is to be understood that many changes and modifications may be made thereunto without departing from the spirit and scope of the invention as defined in the appended claims.

What is claimed is:

1. A process for producing epitaxially coated semiconductor wafers having a low-oxygen zone formed by epitaxy on a monocrystalline substrate wafer in a single-wafer reactor, comprising
    depositing on said substrate wafer a first epitaxial layer having a layer thickness of 1 to 20 μm at a first temperature, wherein the doping of said first epitaxial layer is chosen in such a way that the resistivity of said first epitaxial layer is the same, or higher within narrow tolerances of 5 to 20% than the resistivity of said substrate wafer; and
    depositing on said first epitaxial layer a second epitaxial layer having a layer thickness of 1 to 100 μm at a second temperature which is lower than the first temperature, with the wafer thickness thereby being increased.

2. The process as claimed in claim 1,
    wherein the deposition of said first and second epitaxial layers is carried out by decomposing at least one gas selected from the group consisting of tetrachlorosilane ($SiCl_4$), trichlorosilane ($SiCl_3H$), dichlorosilane ($SiCl_2H_2$) and silane ($SiH_4$).

3. The process as claimed in claim 1,
    wherein the deposition of said first and second epitaxial layers is carried out in the range of from 10 mm Hg to atmospheric pressure.

4. The process as claimed in claim 1,
    wherein the deposition of said first and second epitaxial layers is carried out at temperatures in the range of from 900° C. to 1,250° C.

5. The process as claimed in claim 1, wherein the deposition of said first and second epitaxial layers is carried out at a rate of 2 to 6 μm per minute.

6. The process as claimed in claim 1, further comprising before the deposition of said first and second epitaxial layers;

treating the reactor with an etchant; and
treating the wafer with an etchant.

7. The process as claimed in claim 1, comprising carrying out the deposition of said first and second epitaxial layers with the addition of dopant gases selected from the group consisting of diborane, arsine and phosphine.

* * * * *